(12) United States Patent
Chiang et al.

(10) Patent No.: US 10,170,573 B1
(45) Date of Patent: Jan. 1, 2019

(54) SEMICONDUCTOR DEVICE AND FABRICATION METHOD THEREOF

(71) Applicant: UNITED MICROELECTRONICS CORP., Hsin-Chu (TW)

(72) Inventors: Chun-Ting Chiang, Kaohsiung (TW); Jie-Ning Yang, Pingtung County (TW); Chi-Ju Lee, Tainan (TW); Chih-Wei Lin, Kaohsiung (TW); Bo-Yu Su, Tainan (TW); Yen-Liang Wu, Taipei (TW); I-Fan Chang, Hsinchu (TW); Jui-Ming Yang, Taichung (TW); Wen-Tsung Chang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/730,748

(22) Filed: Oct. 12, 2017

(30) Foreign Application Priority Data

Sep. 14, 2017 (CN) .......................... 2017 1 0826586

(51) Int. Cl.
*H01L 29/423* (2006.01)
*H01L 29/40* (2006.01)
*H01L 29/66* (2006.01)

(52) U.S. Cl.
CPC ........ *H01L 29/4236* (2013.01); *H01L 29/401* (2013.01); *H01L 29/408* (2013.01); *H01L 29/4232* (2013.01); *H01L 29/42364* (2013.01); *H01L 29/42372* (2013.01); *H01L 29/66477* (2013.01); *H01L 29/66613* (2013.01)

(58) Field of Classification Search
CPC ............. H01L 29/4232; H01L 29/4236; H01L 29/42356; H01L 29/66613; H01L 29/66477
See application file for complete search history.

(56) References Cited

U.S. PATENT DOCUMENTS 5,221,853 A * 6/1993 Joshi ................. H01L 21/28518
257/383
9,263,392 B1 * 2/2016 Lin ....................... H01L 29/785

* cited by examiner

*Primary Examiner* — Selim Ahmed
*Assistant Examiner* — Evan Clinton
(74) *Attorney, Agent, or Firm* — Winston Hsu

(57) ABSTRACT

A semiconductor device includes a substrate, a metal gate on the substrate, and a first inter-layer dielectric (ILD) layer around the metal gate. A top surface of the metal gate is lower than a top surface of the ILD layer thereby forming a recessed region atop the metal gate. A mask layer is disposed in the recessed region. A void is formed in the mask layer within the recessed region. A second ILD layer is disposed on the mask layer and the first ILD layer. A contact hole extends into the second ILD layer and the mask layer. The contact hole exposes the top surface of the metal gate and communicates with the void. A conductive layer is disposed in the contact hole and the void.

10 Claims, 6 Drawing Sheets

SEMICONDUCTOR DEVICE AND FABRICATION METHOD THEREOF

CROSS REFERENCE TO RELATED APPLICATION

This application claims the priority from CN application No. 201710826586.0, filed Sep. 14, 2017, which is included in its entirety herein by reference.

BACKGROUND OF THE INVENTION

1. Field of the Invention

The present invention relates to the field of semiconductor technology, and more particularly to a semiconductor device and a method for producing the same.

2. Description of the Prior Art

In current high-k metal gate (HKMG) processes, particularly during the stage for fabricating self-aligned contacts (SAC), part of the metal gate is typically removed and a protective mask layer is formed on the metal gate. The deposited protective mask layer is then planarized through chemical mechanical polishing (CMP) process so that the surface of the remaining mask layer is even with the surface of the interlayer dielectric (ILD) layer.

This design however causes contact plugs formed thereafter to be too close to the metal gates thereby affecting performance of the device. With the miniaturization of the components, how to reduce the resistance of the metal gate, and how to reduce the parasitic capacitance between the contact plug and the metal gate, has become a problem that this technical field is eager to overcome.

SUMMARY OF THE INVENTION

The main object of the present invention is to provide an improved semiconductor structure which can solve the above-mentioned disadvantages and shortcomings of the prior art.

According to one embodiment, a semiconductor device includes a substrate, a metal gate on the substrate, and a first inter-layer dielectric (ILD) layer around the metal gate. A top surface of the metal gate is lower than a top surface of the ILD layer thereby forming a recessed region atop the metal gate. A mask layer is disposed in the recessed region. A void is provided in the mask layer within the recessed region. A second inter-layer dielectric (ILD) layer is disposed on the mask layer and the first ILD layer. A contact hole extends into the second ILD layer and the mask layer. The contact hole exposes the top surface of the metal gate and communicates with the void. A conductive layer is disposed in the contact hole and the void.

According to another embodiment, a method for fabricating a semiconductor device is provided. A metal gate is formed on a substrate. A first inter-layer dielectric (ILD) layer is formed around the metal gate. A top surface of the metal gate is lower than a top surface of the ILD layer thereby forming a recessed region atop the metal gate. A mask layer is formed in the recessed region. A void is formed in the mask layer within the recessed region. A second inter-layer dielectric (ILD) layer is deposited on the mask layer and the first ILD layer. A contact hole extends into the second ILD layer and the mask layer. The contact hole exposes the top surface of the metal gate and communicates with the void. A conductive layer is deposited into the contact hole and the void.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
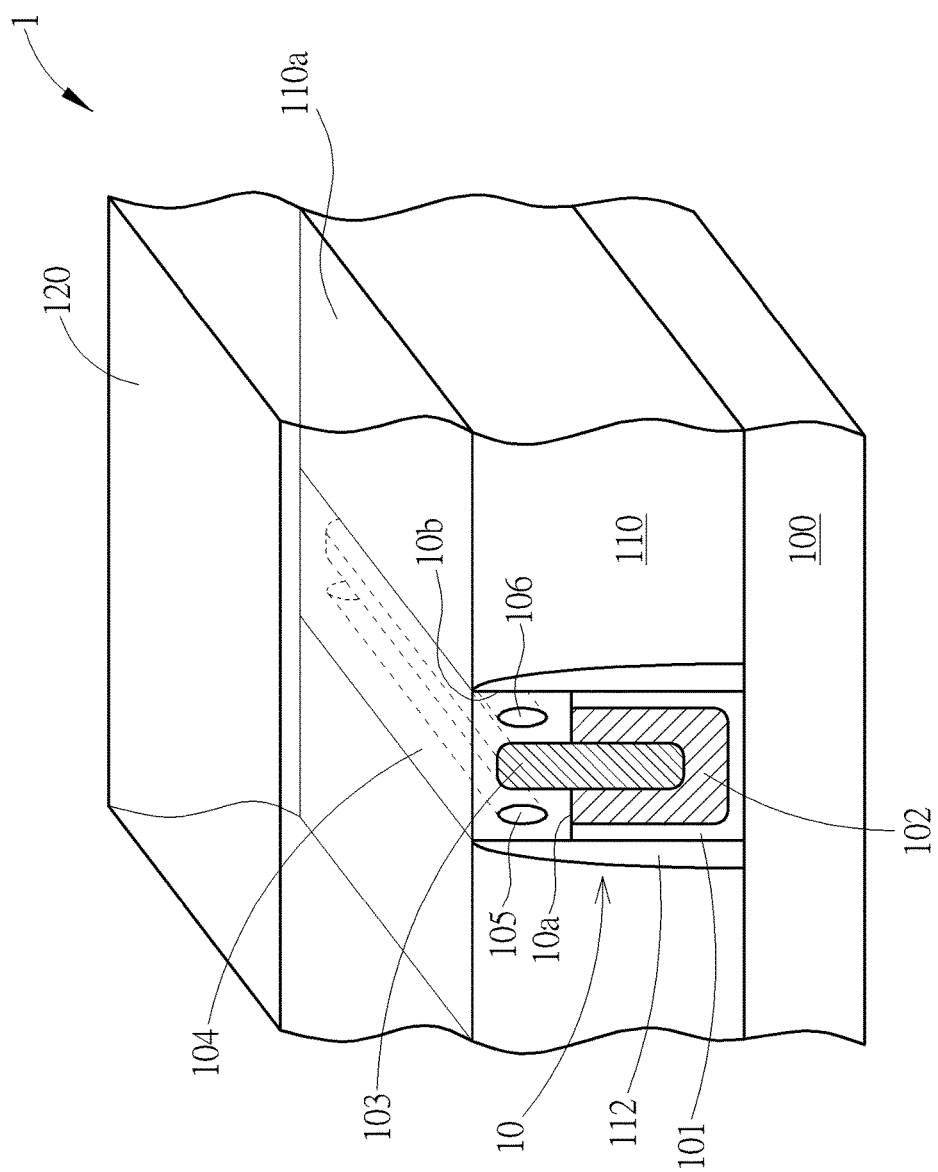
FIGS. 1 to 3 are schematic, cross-sectional diagrams showing a method of fabricating a semiconductor device according to one embodiment of the present invention.

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural changes may be made without departing from the scope of the present disclosure.

The following detailed description is, therefore, not to be taken in a limiting sense, and the scope of the present invention is defined only by the appended claims, along with the full scope of equivalents to which such claims are entitled. One or more implementations of the present invention will now be described with reference to the attached drawings, wherein like reference numerals are used to refer to like elements throughout, and wherein the illustrated structures are not necessarily drawn to scale.

Figure 2:
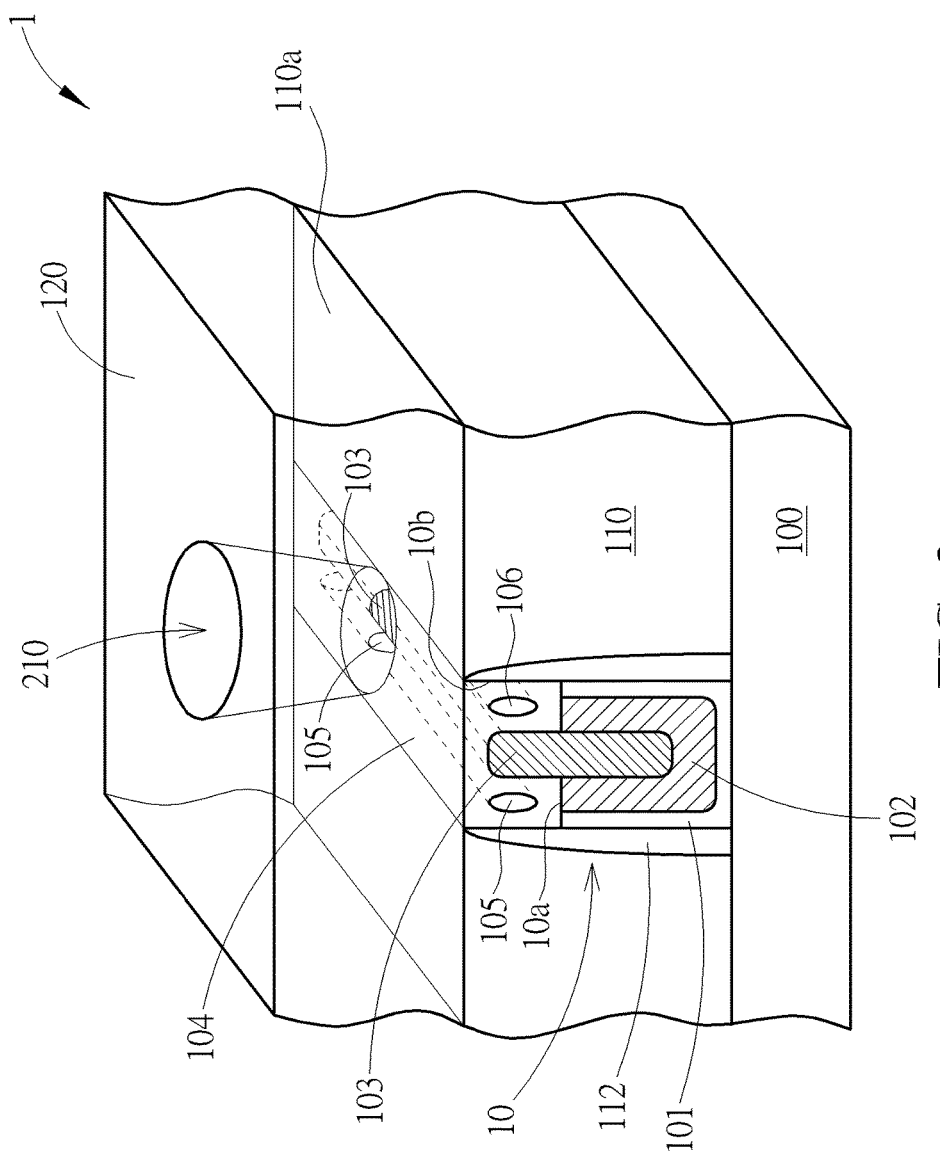
Figure 3:
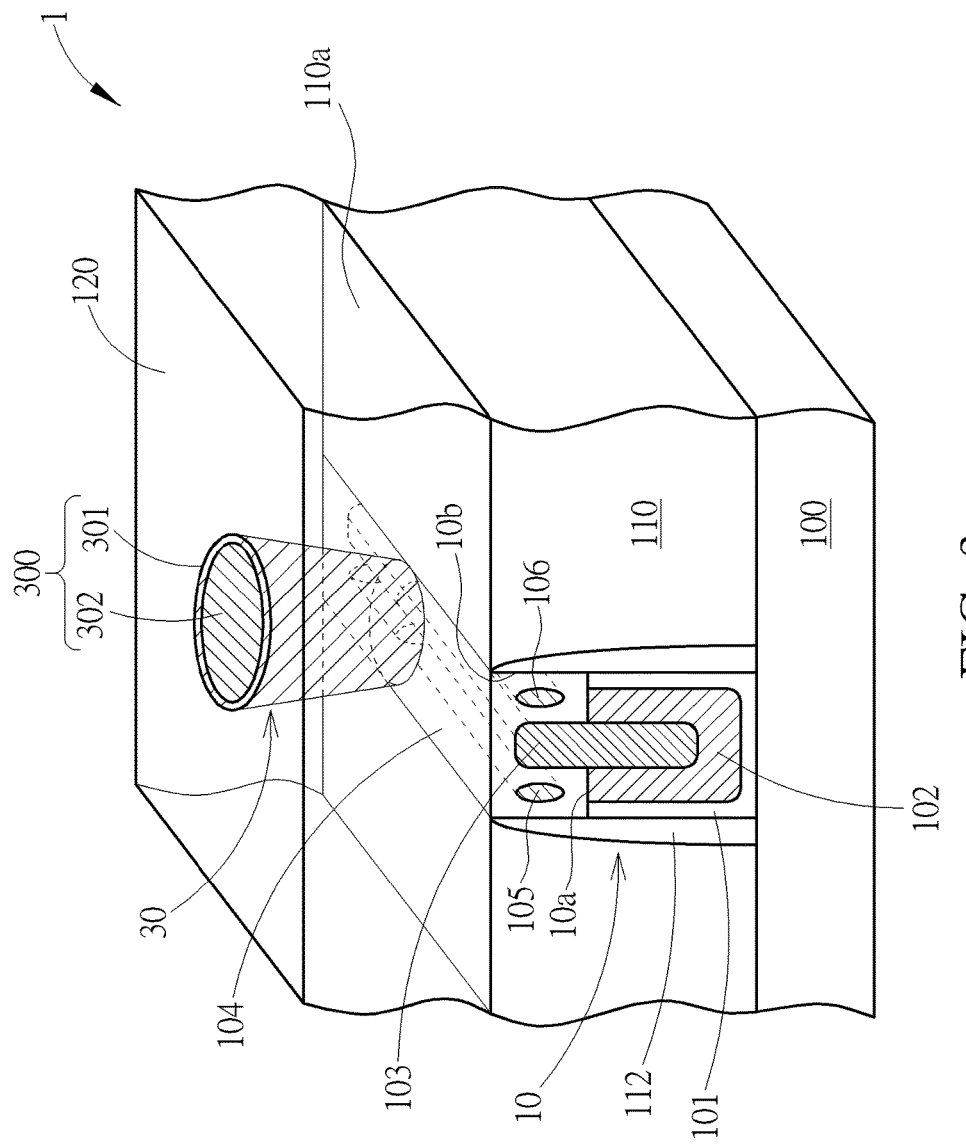

Referring to FIGS. 1 to 3, there is shown a schematic view of a method of fabricating a semiconductor device 1 according to an embodiment of the present invention. As shown in FIG. 1, a substrate 100 is provided. For example, the substrate 100 may be a silicon substrate, but is not limited thereto. A first interlayer dielectric (ILD) layer 110 including, but not limited to, a silicon oxide layer, is deposited on the substrate 100. A metal gate 10 is formed in the first ILD layer 110 on the substrate 100.

Those skilled in the art will understand that the substrate 100 may include a doped or ion well (not shown). In addition, the substrate 100 may also include a fin-like structure (not shown) to form a fin-type field effect transistor (FinFET).

According to an embodiment of the present invention, the top surface 10a of the metal gate 10 is lower than the top surface 110a of the first ILD layer 110, and a recessed region 10b is formed on the metal gate 10.

According to an embodiment of the present invention, the metal gate 10 may comprise a high dielectric constant (high-k) dielectric layer 101, at least one conductive layer 102, and a tungsten layer 103. The tungsten layer 103 protrudes from the top surface 10a of the metal gate 10. The conductive layer 102 may further include a barrier layer and a work function metal layer.

According to an embodiment of the present invention, a spacer 112 may be disposed between the metal gate 10 and the first ILD layer 110. The spacer 112 may comprise silicon nitride, silicon carbon nitride (SiCN) or silicon oxynitride (SiON), but is not limited thereto.

The method of manufacturing the metal gate 10 described above can be formed by a conventional high-k metal gate (HKMG) process, and the details of the known HKMG process are not described in detail.

Next, a mask layer 104, such as silicon nitride or silicon carbon nitride (SiCN), is deposited in the recessed region 10b above the metal gate 10. According to an embodiment of the present invention, the mask layer 104 may be deposited by chemical vapor deposition (CVD), atomic layer deposition (ALD) or other methods.

During the deposition of the mask layer 104, voids 105 and 106 may be formed in the mask layer 104 within the recessed region 10b. The voids 105 and 106 are formed on both sides of the tungsten layer 103, respectively, between the tungsten layer 103 and the spacer 112. In addition, the voids 105 and 106 are located lower than the top surface 110a of the first ILD layer 110.

According to an embodiment of the present invention, after the mask layer 104 is deposited, the mask layer 104 can be planarized by a chemical mechanical polishing (CMP) process so that the top surface of the mask layer 104 is flush with the top surface 110a of the first ILD layer 110.

Next, a second interlayer dielectric (ILD) layer 120 including, but not limited to, a silicon oxide layer, is deposited on the mask layer 104 and the first ILD layer 110.

As shown in FIG. 2, a contact hole 210 is formed in the second ILD layer 120 and the mask layer 104. According to an embodiment of the present invention, the manner in which the contact holes 210 are formed may utilize lithography and etching processes. The shape of the contact hole 210 is not limited to the circular shape shown in FIG. 2, and may include an ellipse, a square, a rectangle, or the like. In addition, if the shape of the contact hole 210 is rectangular, the direction of the major axis may be parallel or perpendicular to the extending direction of the metal gate 10.

According to an embodiment of the present invention, the contact hole 210 exposes the top surface 10a of the metal gate 10 and the tungsten layer 103 protruding from the top surface 10a of the metal gate 10. The contact hole 210 communicates with the voids 105 and 106.

As shown in FIG. 3, a conductive layer 300 is deposited in the contact hole 210 and the voids 105, 106. According to an embodiment of the present invention, the conductive layer 300 may be deposited by CVD, ALD or other methods. According to an embodiment of the present invention, the conductive layer 300 may comprise a titanium silicide layer 301. According to an embodiment of the present invention, the conductive layer 300 may comprise a tungsten layer 302. According to an embodiment of the present invention, after the conductive layer 300 is deposited, the conductive layer 300 can be planarized by CMP to form a contact plug 30.

Structurally, it can be seen from FIG. 3 that the semiconductor device 1 of the present invention comprises a substrate 100, a metal gate 10 provided on the substrate 100, and a first ILD layer 110 disposed around the metal gate 10. The top surface 10a of the metal gate 10 is lower than the top surface 110a of the first ILD layer 110 and forms a recessed region 10b on the metal gate 10. The mask layer 104 is provided in the recessed region 10b. The voids 105, 106 are located in the mask layer 104 within the recessed region 10b. The second ILD layer 120 is provided on the mask layer 104 and the first ILD layer 110. The contact hole 210 penetrates through the second ILD layer 120 and the mask layer 104. The contact hole 210 exposes the top surface 10a of the metal gate 10 and communicates with the voids 105, 106.

The conductive layer 300 is deposited into the contact hole 210 and extends into the voids 105, 106.

According to an embodiment of the present invention, the mask layer 104 comprises silicon nitride or silicon carbon nitride. According to an embodiment of the present invention, the voids 105, 106 are lower than the top surface 110a of the first ILD layer 110. The metal gate 10 includes a tungsten layer 103 protruding from the top surface 10a of the metal gate 10. The voids 105, 106 are provided on two opposite sides of the tungsten layer 103, respectively. According to an embodiment of the present invention, the conductive layer 300 comprises a titanium silicide layer 301 and a tungsten layer 302.

One advantage of the present invention is that the conductive layer 300 is filled into the contact hole 210 and extends into the voids 105, 106 to reduce the resistance of the metal gate 10 and the contact plug 30. By extending into the voids 105, 106, the conductive layer 300 can reduce the parasitic capacitance between the metal gate 10 and other adjacent plugs (not shown), thereby enhancing the performance of the semiconductor device 1.

Figure 4:
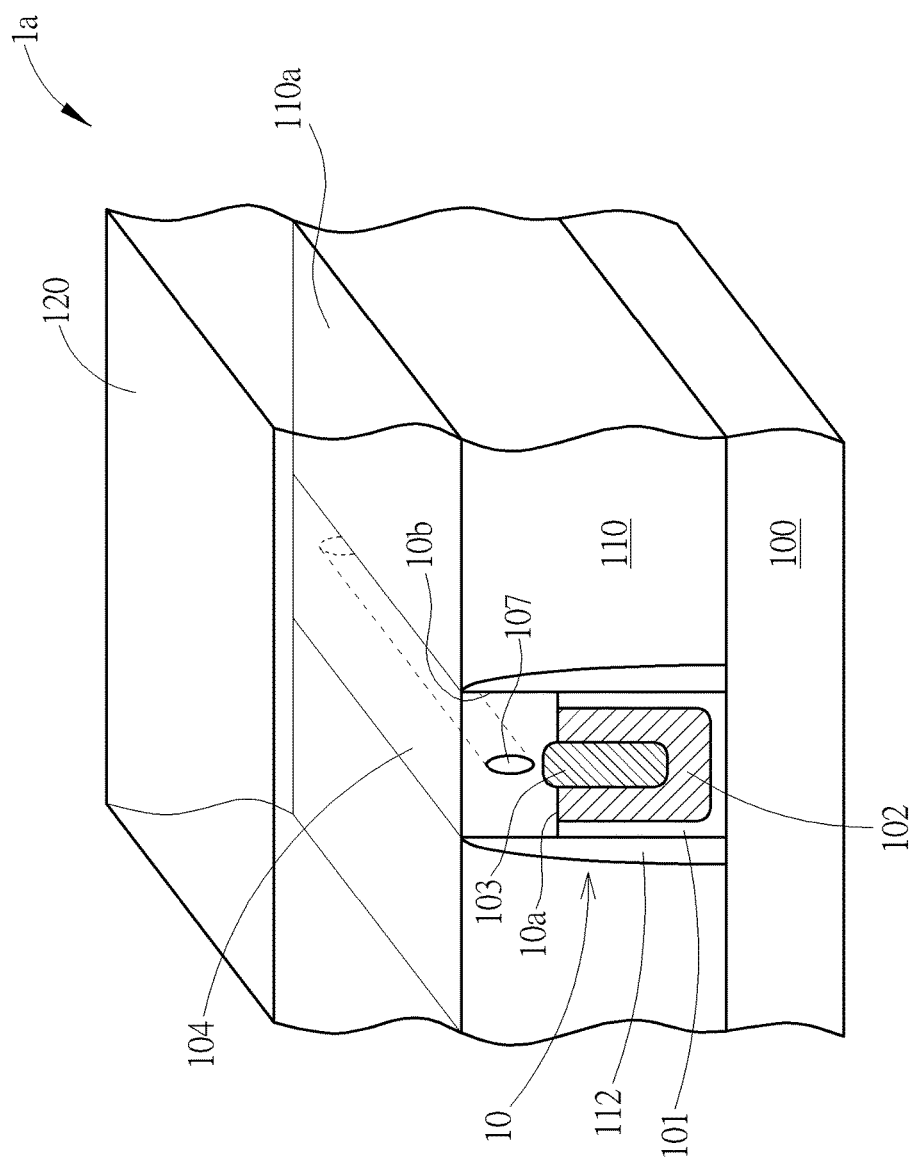
FIGS. 4 to 6 are schematic, cross-sectional diagrams showing a method of fabricating a semiconductor device according to another embodiment of the present invention.
Figure 5:
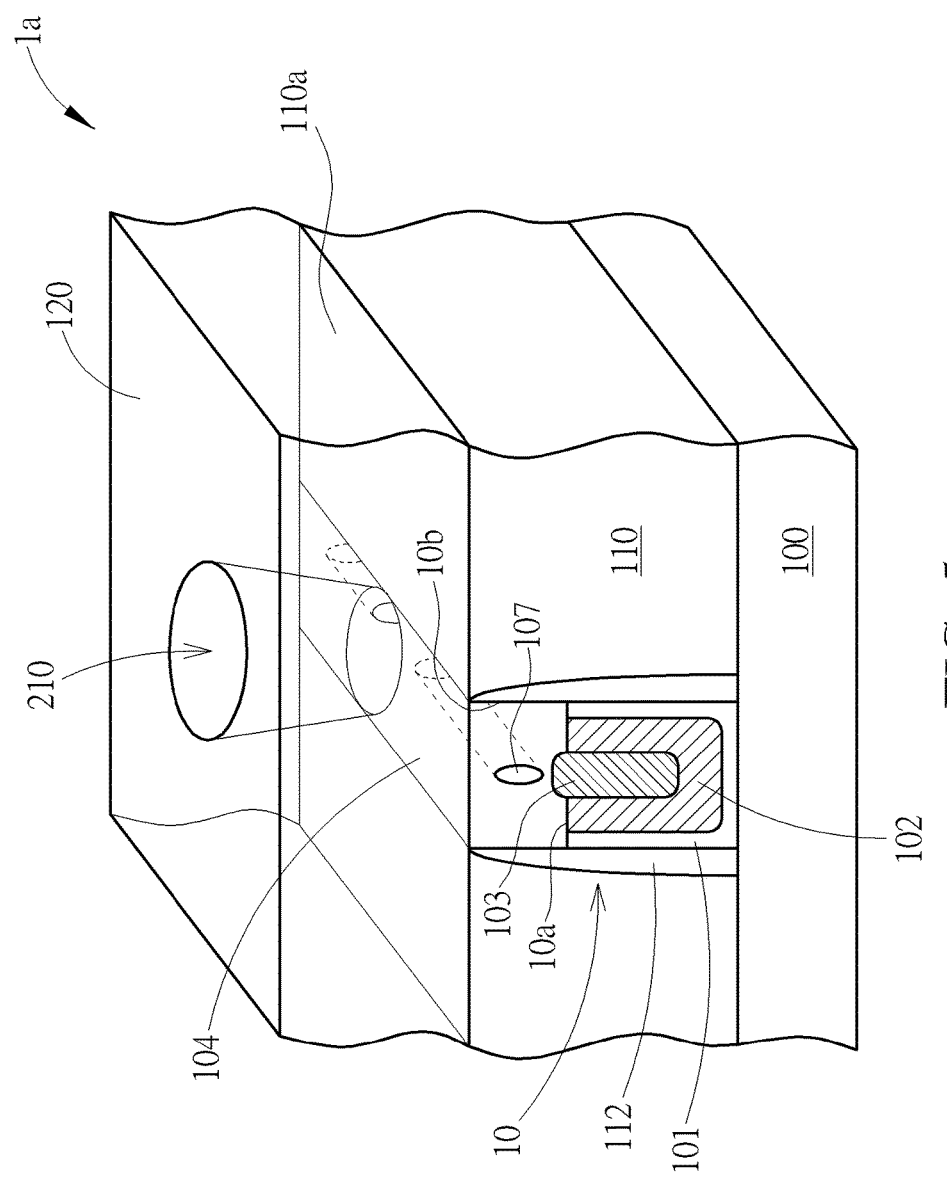
Figure 6:
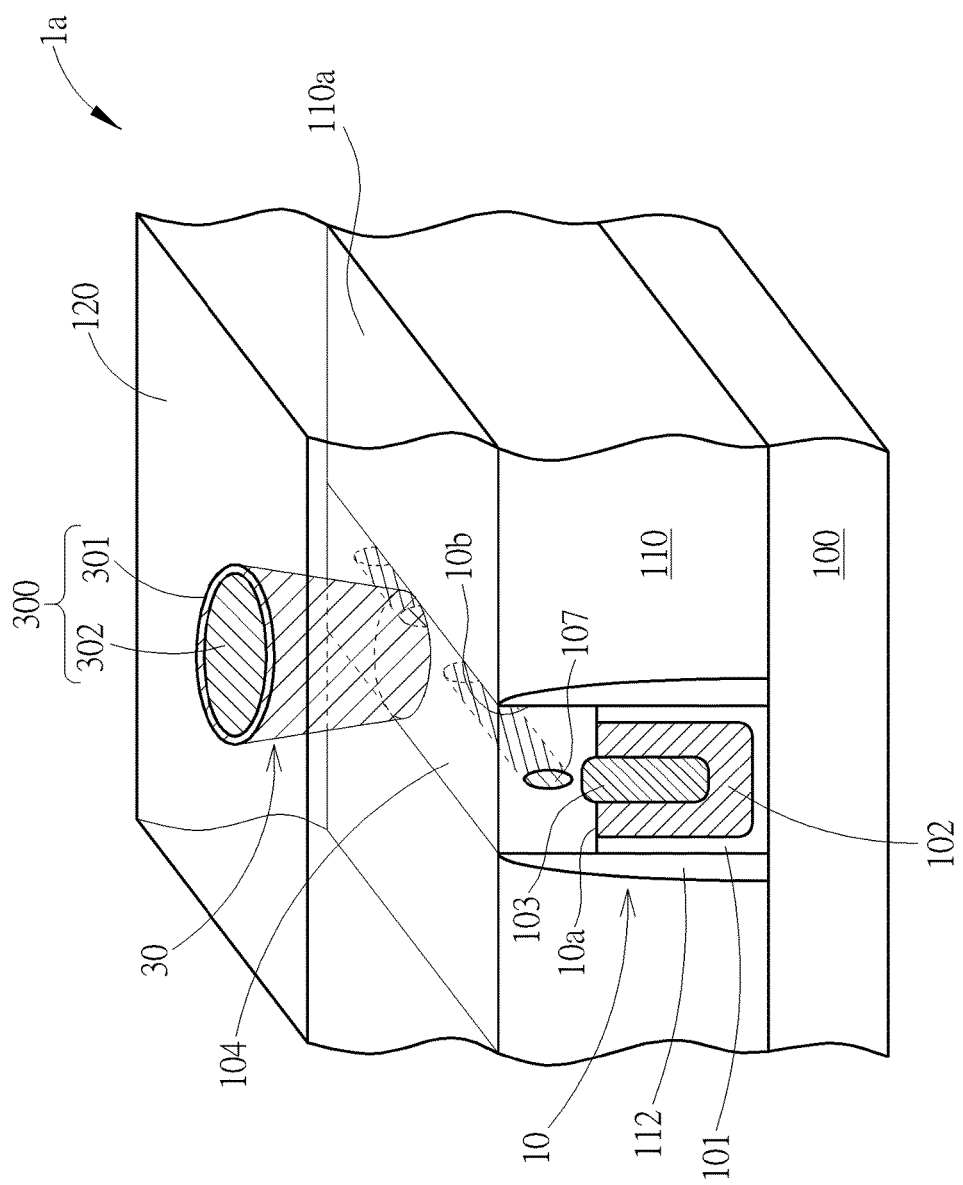

Referring to FIGS. 4 to 6, which are schematic views showing a method of fabricating a semiconductor device 1a according to another embodiment of the present invention, wherein like element, region or material layer is still represented by the same reference numerals.

As shown in FIG. 4, a substrate 100, such as a silicon substrate, is first provided. A first ILD layer 110, such as a silicon oxide layer, is deposited on the substrate 100. A metal gate 10 is formed in the first ILD layer 110 on the substrate 100. The top surface 10a of the metal gate 10 is lower than the top surface 110a of the first ILD layer 110 and forms a recessed region 10b on the metal gate 10.

According to an embodiment of the present invention, the metal gate 10 may comprise a high-k dielectric layer 101, at least one conductive layer 102, and a tungsten layer 103. The tungsten layer 103 slightly protrudes from the top surface 10a of the metal gate 10. The conductive layer 102 may further include a barrier layer and a work function metal layer. Between the metal gate 10 and the first ILD layer 110, there may be a spacer 112, such as silicon nitride, silicon carbon nitride (SiCN), or silicon oxynitride (SiON), but is not limited thereto.

Next, a mask layer 104, such as silicon nitride or silicon carbon nitride, is deposited in the recessed region 10b above the metal gate 10. According to an embodiment of the present invention, the mask layer 104 may be deposited by CVD, ALD or other methods.

During the deposition of the mask layer 104, a void 107 may be formed in the mask layer 104 within the recessed region 10b. The void 107 is formed at the center of the mask layer 104 directly above the tungsten layer 103. In addition, the void 107 is lower than the top surface 110a of the first ILD layer 110.

According to an embodiment of the present invention, after the mask layer 104 is deposited, the mask layer 104 can be planarized by CMP so that the top surface of the mask layer 104 is flush with the top surface 110a of the ILD layer 110. Next, a second ILD layer 120, such as a silicon oxide layer, is deposited on the mask layer 104 and the first ILD layer 110.

As shown in FIG. 5, a contact hole 210 is formed in the second ILD layer 120 and the mask layer 104. The shape of the contact hole 210 is not limited to the circular shape shown in FIG. 5, and may include an ellipse, a square, a rectangle, or the like. In addition, if the shape of the contact hole 210 is rectangular, the direction of the major axis may be parallel or perpendicular to the extending direction of the metal gate 10.

According to an embodiment of the present invention, the contact hole 210 exposes the top surface 10a of the metal gate 10 and the tungsten layer 103 slightly protruding from the top surface 10a of the metal gate 10. The contact hole 210 communicates with the void 107.

As shown in FIG. 6, a conductive layer 300 is filled in the contact hole 210 and the void 107. According to an embodiment of the present invention, the conductive layer 300 may be deposited by CVD, ALD or other methods. According to an embodiment of the present invention, the conductive layer 300 may comprise a titanium silicide layer 301. According to an embodiment of the present invention, the conductive layer 300 may comprise a tungsten layer 302. According to an embodiment of the present invention, after the conductive layer 300 is deposited, the conductive layer 300 can be planarized by CMP to form a contact plug 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a metal gate on the substrate, wherein the metal gate comprises a tungsten layer protruding from the top surface of the metal gate;
   a first inter-layer dielectric (ILD) layer around the metal gate, wherein a top surface of the metal gate is lower than a top surface of the ILD layer thereby forming a recessed region atop the metal gate, wherein the recessed region is separated by the tungsten layer into a first sub-region and a second sub-region;
   a mask layer in the recessed region;
   a first void in the mask layer within the first sub-region of the recessed region;
   a second void in the mask layer within the second sub-region of the recessed region;
   a second inter-layer dielectric (ILD) layer on the mask layer and the first ILD layer;
   a contact hole extending into the second ILD layer and the mask layer, wherein the contact hole exposes the top surface of the metal gate and communicates with the first and second voids; and
   a conductive layer disposed in the contact hole and the first and second voids.

2. The semiconductor device according to claim 1, wherein the mask layer comprises silicon nitride or silicon carbon nitride.

3. The semiconductor device according to claim 1, wherein the first and second voids are lower than the top surface of the first ILD layer.

4. The semiconductor device according to claim 1, wherein the conductive layer comprises a titanium silicide layer.

5. The semiconductor device according to claim 4, wherein the conductive layer further comprises a tungsten layer.

6. A method for fabricating a semiconductor device, comprising:
   providing a substrate;
   forming a metal gate on the substrate, wherein the metal gate comprises a tungsten layer protruding from the top surface of the metal gate;
   forming a first inter-layer dielectric (ILD) layer around the metal gate, wherein a top surface of the metal gate is lower than a top surface of the ILD layer thereby forming a recessed region atop the metal gate, wherein the recessed region is separated by the tungsten layer into a first sub-region and a second sub-region;
   forming a mask layer in the recessed region;
   forming a first void in the mask layer within the first sub-region of the recessed region;
   forming a second void in the mask layer within the second sub-region of the recessed region;
   depositing a second inter-layer dielectric (ILD) layer on the mask layer and the first ILD layer;
   forming a contact hole extending into the second ILD layer and the mask layer, wherein the contact hole exposes the top surface of the metal gate and communicates with the first and second voids; and
   depositing a conductive layer into the contact hole and the first and second voids.

7. The method according to claim 6, wherein the mask layer comprises silicon nitride or silicon carbon nitride.

8. The method according to claim 6, wherein the first and second voids are lower than the top surface of the first ILD layer.

9. The method according to claim 6, wherein the conductive layer comprises a titanium silicide layer.

10. The method according to claim 9, wherein the conductive layer further comprises a tungsten layer.

* * * * *